United States Patent
Jacobs et al.

(10) Patent No.: US 7,184,954 B1
(45) Date of Patent: Feb. 27, 2007

(54) METHOD AND APPARATUS FOR DETECTING BAD DATA PACKETS RECEIVED BY A MOBILE TELEPHONE USING DECODED SPEECH PARAMETERS

(75) Inventors: Paul E. Jacobs, La Jolla, CA (US); Andrew P. Dejaco, San Diego, CA (US)

(73) Assignee: Qualcomm Inc., San Diego, CA (US)

( * ) Notice: Subject to any disclaimer, the term of this patent is extended or adjusted under 35 U.S.C. 154(b) by 587 days.

(21) Appl. No.: 09/260,709

(22) Filed: Mar. 1, 1999

Related U.S. Application Data

(63) Continuation-in-part of application No. 08/740,685, filed on Nov. 1, 1996, now abandoned, which is a continuation-in-part of application No. 08/719,358, filed on Sep. 25, 1996.

(51) Int. Cl.
*G10L 21/02* (2006.01)

(52) U.S. Cl. .................................................. 704/226
(58) Field of Classification Search .............. 704/200, 704/201, 220, 222, 229; 370/342; 375/225
See application file for complete search history.

(56) References Cited

U.S. PATENT DOCUMENTS

| | | | | |
|---|---|---|---|---|
| 4,777,633 A | * | 10/1988 | Fletcher et al. ............. 370/345 |
| 4,802,171 A | * | 1/1989 | Rasky ......................... 714/747 |
| 5,097,507 A | * | 3/1992 | Zinser et al. ................ 704/226 |
| 5,113,400 A | * | 5/1992 | Gould et al. ................. 371/43.7 |
| 5,208,812 A | * | 5/1993 | Dudek et al. ................ 370/280 |
| 5,416,779 A | * | 5/1995 | Barnes et al. ................ 370/280 |
| 5,461,639 A | * | 10/1995 | Wheatley, III et al. ..... 370/342 |
| 5,495,555 A | * | 2/1996 | Swaminathan ............... 704/207 |
| 5,517,511 A | * | 5/1996 | Hardwick et al. .......... 714/755 |
| 5,572,622 A | * | 11/1996 | Wigren et al. .............. 704/228 |
| 5,596,676 A | * | 1/1997 | Swaminathan et al. ..... 704/208 |
| 5,598,506 A | * | 1/1997 | Wigren et al. .............. 704/233 |
| 5,615,412 A | * | 3/1997 | Doran ......................... 455/222 |
| 5,870,405 A | * | 2/1999 | Hardwick et al. .......... 714/701 |
| 5,918,204 A | * | 6/1999 | Tsurumaru .................. 704/214 |
| 5,970,399 A | * | 10/1999 | Rostamy et al. ............ 455/222 |
| 6,148,422 A | * | 11/2000 | Strawczynski et al. ..... 714/704 |

FOREIGN PATENT DOCUMENTS

| | | |
|---|---|---|
| WO | 9609704 | 3/1996 |
| WO | 9618251 | 6/1996 |
| WO | 9619798 | 6/1996 |

\* cited by examiner

*Primary Examiner*—Doris H. To
*Assistant Examiner*—Michael N. Opsasnick
(74) *Attorney, Agent, or Firm*—Phil R. Wadsworth; Sandra L. Godsey; Thomas R. Rouse

(57) ABSTRACT

A speech signal is decoded by a vocoder and the reconstructed speech samples are provided to a decoded frame check unit. The decoded frame check unit examines the energy of the reconstructed speech and compares the energy of the reconstructed speech to a range of acceptable energy values. If the energy is not within the range of energy values, a frame erasure is declared and the decoded frame is prevented from being to the speaker in the telephone. In the exemplary implementation, the speech is reconstructed by a vocoder which includes a postfilter which in turn includes automatic gain control. The automatic gain control element of a post filter includes a means for measuring the energy of the decoded speech data. This measured energy is used by the decoded frame check unit to decide whether to provide the decoded data to the user or to declare a frame erasure. This implementation reduces the amount of additional hardware necessary to implement the present invention.

8 Claims, 9 Drawing Sheets

FULL RATE FRAME

HALF RATE FRAME

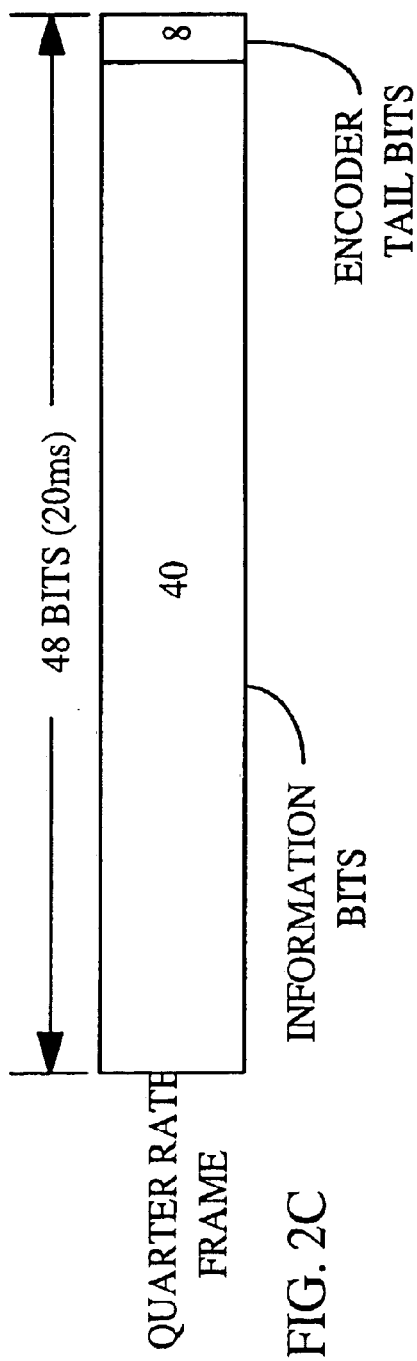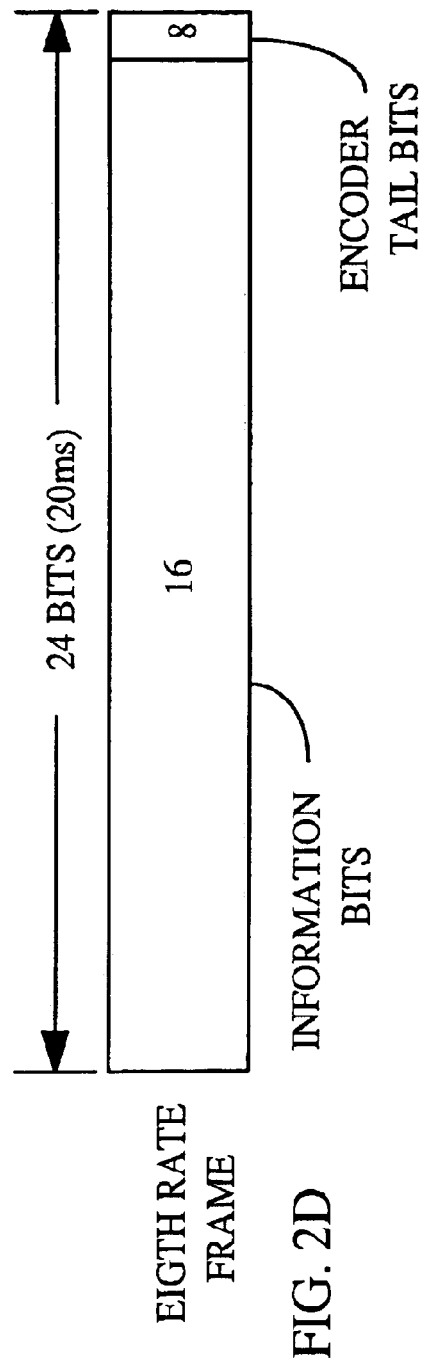
FIG. 2C  QUARTER RATE FRAME
FIG. 2D  EIGTH RATE FRAME

METHOD AND APPARATUS FOR DETECTING BAD DATA PACKETS RECEIVED BY A MOBILE TELEPHONE USING DECODED SPEECH PARAMETERS

FILE HISTORY

The present application is a continuation-in-part of U.S. application Ser. No. 08/740,685, filed Nov. 1, 1996 now abandoned, which is a continuation-in-part of U.S. application Ser. No. 08/719,358, filed Sep. 25, 1996, entitled "METHOD AND APPARATUS FOR DETECTING BAD DATA PACKETS RECEIVED BY A MOBILE TELEPHONE USING DECODED SPEECH PARAMETERS".

BACKGROUND OF THE INVENTION

I. Field of the Invention

The invention generally relates to digital telephone systems and in particular to techniques for detecting bad data packets.

II. Description of the Related Art

FIG. 1 is an illustrative block diagram of a variable rate CDMA transmission system 10 described in the Telecommunications Industry Association's Interim Standard *TIA/EIA/IS-95-A Mobile Station-Base Station Compatibility Standard for Dual-Mode Wideband Spread Spectrum Cellular System*. This transmission system may be provided, for example, within a base station of a cellular transmission system for use in transmitting signals to mobile telephones within a cell surrounding the base station.

A microphone 11 detects a speech signal which is then sampled and digitized by an analog to digital converter (not shown). A variable rate data source 12 receives the digitized samples of the speech signal and encodes the signal to provide packets of encoded speech of equal frame lengths. Variable rate data source 12 may, for example, convert the digitized samples of the input speech to digitized speech parameters representative of the input voice signal using Linear Predictive Coding (LPC) techniques. In the exemplary embodiment, the variable rate data source is a variable rate vocoder as described in detail in U.S. Pat. No. 5,414,796 which is assigned to the assignee of the present invention and is incorporated by reference herein. Variable rate data source 12 provides variable rate packets of data at four possible frame rates 9600 bps, 4800 bps, 2400 bps and 1200 bps, referred to herein as full, half, quarter, and eighth rates. Packets encoded at full rate contain 172 information bits, samples encoded at half rate contain 80 information bits, samples encoded at quarter rate contain 40 information bits and samples encoded at eighth rate contain 16 information bits. Packet formats are shown in FIGS. 2A–2D. The packets regardless of size all are one frame length in duration, i.e. 20 ms. Herein, the terms "frame" and "packet" may be used interchangeably.

The packets are encoded and transmitted at different rates to compress the data contained therein based, in part, on the complexity or amount of information represented by the frame. For example, if the input voice signal includes little or no variation, perhaps because the speaker is not speaking, the information bits of the corresponding packet may be compressed and encoded at eighth rate. This compression results in a loss of resolution of the corresponding portion of the voice signal but, given that the corresponding portion of the voice signal contains little or no information, the reduction in signal resolution is not typically noticeable. Alternatively, if the corresponding input voice signal of the packet includes much information, perhaps because the speaker is actively vocalizing, the packet is encoded at full rate and the compression of the input speech is reduced to achieve better voice quality.

This compression and encoding technique is employed to limit, on the average, the amount of signals being transmitted at any one time to thereby allow the overall bandwidth of the transmission system to be utilized more effectively to allow, for example, a greater number of telephone calls to be processed at any one time.

The variable rate packets generated by data source 12 are provided to packetizer 13 which selectively appends cyclic redundancy check (CRC) bits and tail bits. As shown in FIG. 2A, when a frame is encoded by the variable rate data source 12 at full rate, packetizer 13 generates and appends twelve CRC bits and eight tail bits. Similarly, as shown in FIG. 2B, when a frame is encoded by the variable rate data source 12 at half rate, packetizer 13 generates and appends eight CRC bits and eight tail bits. As shown in FIG. 2C, when a frame is encoded by the variable rate data source 12 at quarter rate, packetizer 13 generates and appends eight tail bits. As shown in FIG. 2D, when a frame is encoded by the variable rate data source 12 at eighth rate, packetizer 13 generates and appends eight tail bits.

The variable rate packets from packetizer 13 are then provided to encoder 14 which encodes the bits of the variable rate packets for error detection and correction purposes. In the exemplary embodiment, encoder 14 is a rate 1/3 convolutional encoder. The convolutionally encoded symbols are then provided to a CDMA spreader 16, an implementation of which is described in detail in U.S. Pat. Nos. 5,103,459 and 4,901,307. CDMA spreader 16 maps eight encoded symbols to a 64 bit Walsh symbol and then spreads the Walsh symbols in accordance with a pseudorandom noise (PN) code.

Repetition generator 17 receives the spread packets. For packets of less than full rate, repetition generator 17 generates duplicates of the symbols in the packets to provide packets of a constant data rate. When the variable rate packet is half rate, then repetition generator 17 introduces a factor of two redundancy, i.e. each spread symbol is repeated twice within the output packet. When the variable rate packet is quarter rate, then repetition generator 17 introduces a factor of four redundancy. When the variable rate packet is eighth rate then repetition generator 17 introduces a factor of eight redundancy.

Repetition generator 17 provides the aforementioned redundancy by dividing the spread data packet into smaller sub-packets referred to as "power control groups". In the exemplary embodiment, each power control group consists of 6 PN spread Walsh Symbols. The constant rate frame is generated by consecutively repeating each power control group the requisite number of times to fill the frame as described above.

The spread packets are then provided to a data burst randomizer 18 which removes the redundancy from the spread packets in accordance with a pseudorandom process as described in copending U.S. patent application Ser. No. 08/291,231, filed Aug. 16, 1994 assigned to the assignee of the present invention. Data burst randomizer 18 selects one of the spread power control groups for transmission in accordance with a pseudorandom selection process and gates the other redundant copies of that power control group.

The packets are provided by data burst randomizer 18 to finite impulse response (FIR) filter 20, an example of which is described in U.S. patent application Ser. No. 08/194,823, and assigned to the assignee of the present invention. The filtered signal is then provided to digital to analog converter 22 and converted to an analog signal. The analog signal is then provided to transmitter 24 which upconverts and amplifies the signal for transmission through antenna 26.

FIG. 3 illustrates pertinent components of a mobile telephone 28 or other mobile station receiving the transmitted signal. The signal is received by antenna 30, downconverted and amplified, if necessary, by receiver 32. The signal is then provided to frame rate detection unit 33 which subdivides the signal into packets and determines the corresponding frame rate for each packet. The frame rate may be determined, depending upon the implementation, by detecting the duration of individual bits of the frame. The packet and a signal identifying the detected frame rate for the packet are then forwarded to CRC unit 34 for performing cyclic redundancy checks or related error detection checks in an attempt to verify that no transmission errors or frame rate detection errors occurred. A frame rate detection error results in the packet being sampled at an incorrect rate resulting in a sequence of bits that are effectively random. A transmission error typically results in only one or two bits being in error. Usually, if a transmission error or frame rate detection error occurs, the CRC unit detects the error. "Bad" frames failing the CRC are erased or otherwise discarded by frame erasure unit 36. "Good" frames which pass the CRC are routed to variable rate decoder 40 for conversion back to digitized voice signals. The digitized voice signals are converted to analog signals by a digital to analog converter (not shown) for ultimate output through a speaker 42 of the mobile telephone.

Depending upon the implementation, no separate frame erasure unit 36 is necessarily required. Rather, CRC unit 34 may be configured merely to not output bad frames to variable rate decoder 40. However, provision of a frame erasure unit facilitates generation of frame erasure signals for forwarding back to the base station to notify the base station of the frame erasure error. The base station may use the framer erasure information to modulate the amount of power employed to transmit signals perhaps as part of a feedback system intended to minimize transmitted power while also minimizing frame errors.

As noted above, by varying the frame rate of packets to thereby compress the information contained therein, the overall bandwidth of the system is utilized more effectively, usually without any noticeable effect on the transmitted signal. However, problems occur occasionally which have a noticeable effect. One such problem occurs if a frame subject to a frame rate detection error or a transmission error nevertheless passes the CRC. In such case, the bad frame is not erased but is processed along with other good frames. The error may or may not be noticeable. For example, if the error is a transmission error wherein only one or two bits of encoded speech are in error, the error may have only an extremely slight and probably unnoticeable effect on the output voice signal. However, if the error is a frame rate detection error, the entire packet will thereby be processed using the incorrect frame rate causing effectively random bits to be input to the decoder likely resulting in a noticeable artifact in the output voice signal. For some systems, it has been found that incorrect frame rate detections occur with a probability of about 0.005% yielding an incorrectly received packet and a corresponding artifact in the output voice signal about every sixteen minutes of conversation time. Although described with respect to a CDMA system using TIA/EIA IS-95-A protocols, similar problems can occur in almost any transmission system employing variable transmission rates and in related systems as well.

It would be desirable to remedy the forgoing problem, and it is to that end that the invention is primarily drawn.

SUMMARY OF THE INVENTION

In the present invention, speech is decoded by a vocoder and the reconstructed speech samples are provided to a decoded frame check unit. The decoded frame check unit examines the energy of the decoded speech signal and the rate of the reconstructed speech and compares the energy of the reconstructed speech to a range of acceptable energy values for that rate. If the energy is not within the range of energy values, a frame erasure is declared and the decoded frame is prevented from being provided to the output speaker in the telephone. In the exemplary embodiment, the vocoder is a code excited linear prediction coder. In the present invention when a frame error is detected, the filter parameters of the speech decoder are reinitialized when the decoded frame is determined to be in error to prevent the detected error from corrupting future frames. In an alternative embodiment, the decoded frame check unit, also, examines the high frequency components of the decoded frame's PCM samples and if the energy of the high frequency components are in excess of a threshold, an erasure is declared.

In the exemplary implementation, the speech is reconstructed by a vocoder which includes a postfilter, which in turn includes automatic gain control. The automatic gain control element of a post filter includes a means for measuring the energy of the decoded speech data. This measured energy is used by the decoded frame check unit to decide whether to provide the decoded PCM data to the user or to declare a frame erasure. This implementation reduces the amount of additional hardware necessary to implement the present invention.

In accordance with one aspect of the invention, a signal reception system is provided for use in a mobile telephone system. The signal reception system includes a means for receiving a digitized signal containing speech parameters representative of speech; a means for examining the digitized signal to identify atypical portions of the digitized signal; and a means for eliminating atypical portions of the signal found by the means for examining. The atypical portions are those likely to be erroneous. Depending upon the implementation, the means for examining the digitized signal to identify atypical portions thereof includes a means for comparing the speech parameters of the portions of the digitized signal with predetermined ranges of acceptable speech parameters to identify portions having speech parameters outside of the predetermined ranges. Exemplary types of speech parameters include codebook gain parameters or linear speech predictor (LSP) frequencies.

Hence, a system is provided wherein the actual speech parameters represented by a received digitized speech signal are examined to identify portions of the signal which are atypical and are thereby likely to be erroneous, perhaps as a result of undetected signal transmission errors. For example, if a portion of the received signal is found to have speech parameters representative of very high frequencies not ordinarily found in human speech, the system identifies that portion of the signal as being atypical and eliminates that portion thereby avoiding a potentially annoying transmission error artifact in the speech signal ultimately output to a listener.

In one specific implementation, the foregoing system is provided within a mobile telephone configured to receive signals encoded with TIA/EIA/IS-95-A standards. The signal includes variable rate data packets encoded at potentially different frame rates. Means are provided for detecting the frame rate of each data packet. As noted, an error may occur during detection of the frame rate thereby resulting in the processing of an entire packet using an incorrect frame rate and thus likely resulting in an annoying artifact in the speech signal ultimately provided to the listener. With the invention, such packets are detected and eliminated.

Moreover, principles of the invention may be advantageously employed in other signal reception systems as well. Indeed, principles of the invention may be employed in many system wherein, following otherwise conventional error detection, some amount of redundancy still remains in a received signal. This redundancy can be exploited to allow signals of very low probability to be distinguished from signals of higher probability thereby allowing elimination of the signals having very low probability on the basis that such signals are probably erroneous signals.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIGS. 2A–2D are illustrations of frame formats employed by the system of FIG. 1;

DETAILED DESCRIPTION OF THE PREFERRED EMBODIMENTS

With reference to the remaining figures, exemplary embodiments of the invention will now be described. The exemplary embodiments will primarily be described with reference to block diagrams and flow charts. As to the flowcharts, each block therein represents both a method step and an apparatus element for performing the recited method step. Depending upon the implementation, each apparatus element, or portions thereof, may be configured in hardware, software, firmware or combinations thereof. Also, it should be appreciated that not all components necessary for a complete implementation of a practical system are illustrated or described in detail. Rather, only those components necessary for a thorough understanding of the invention are illustrated and described.

Figure 1:
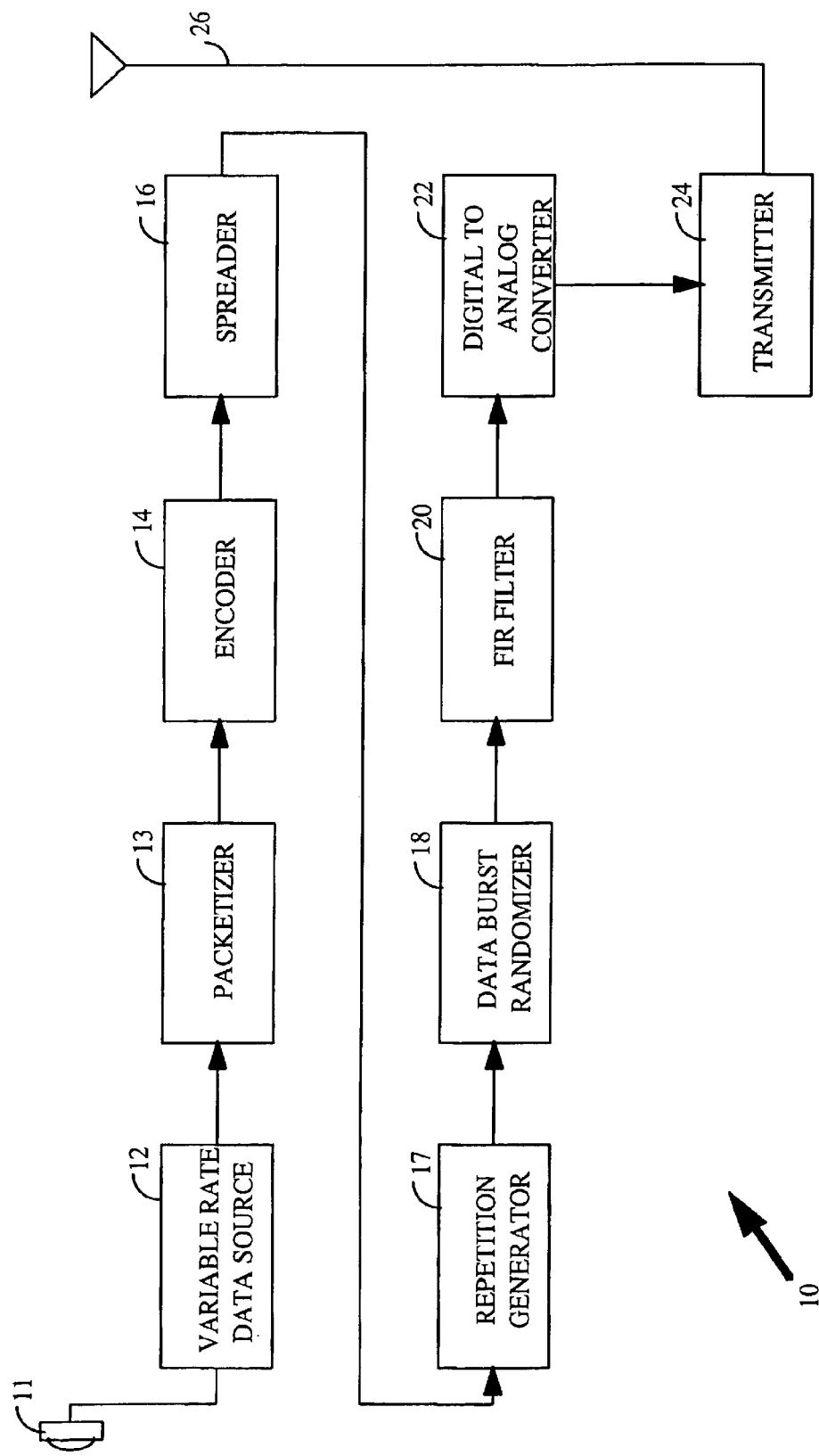
FIG. 1 is a is a block diagram of a transmit portion of a digital cellular telephone system base station.
Figure 2A:
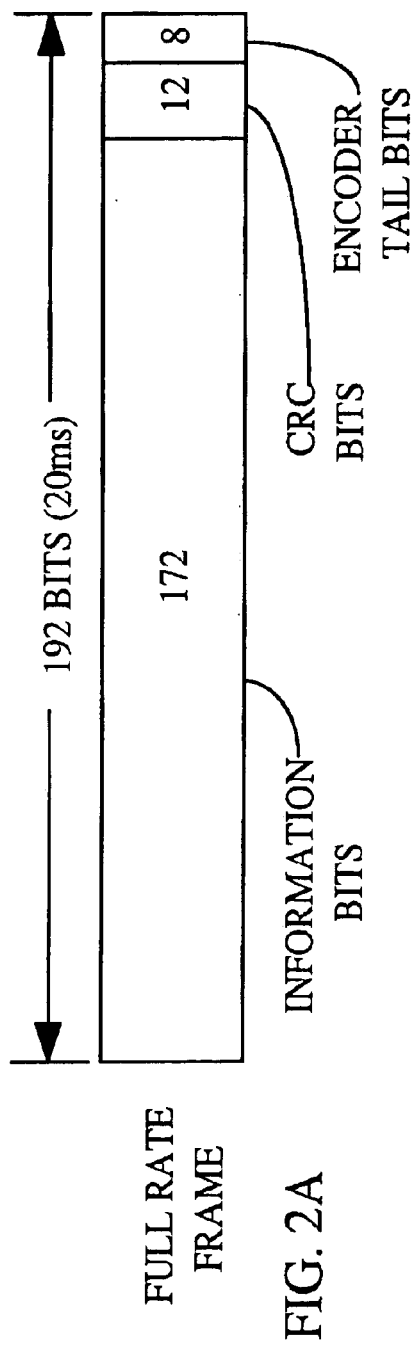
Figure 2B:
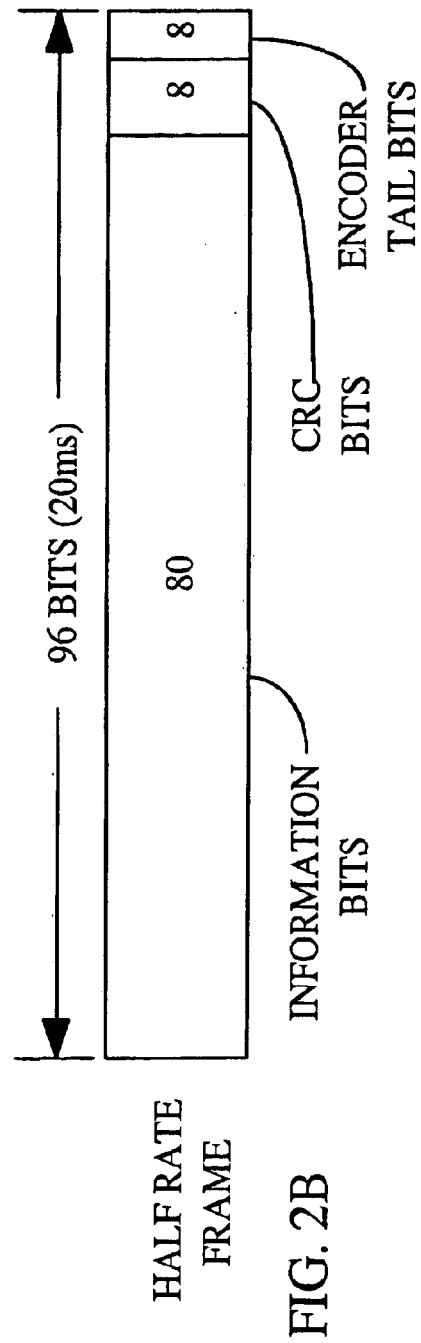
Figure 4:
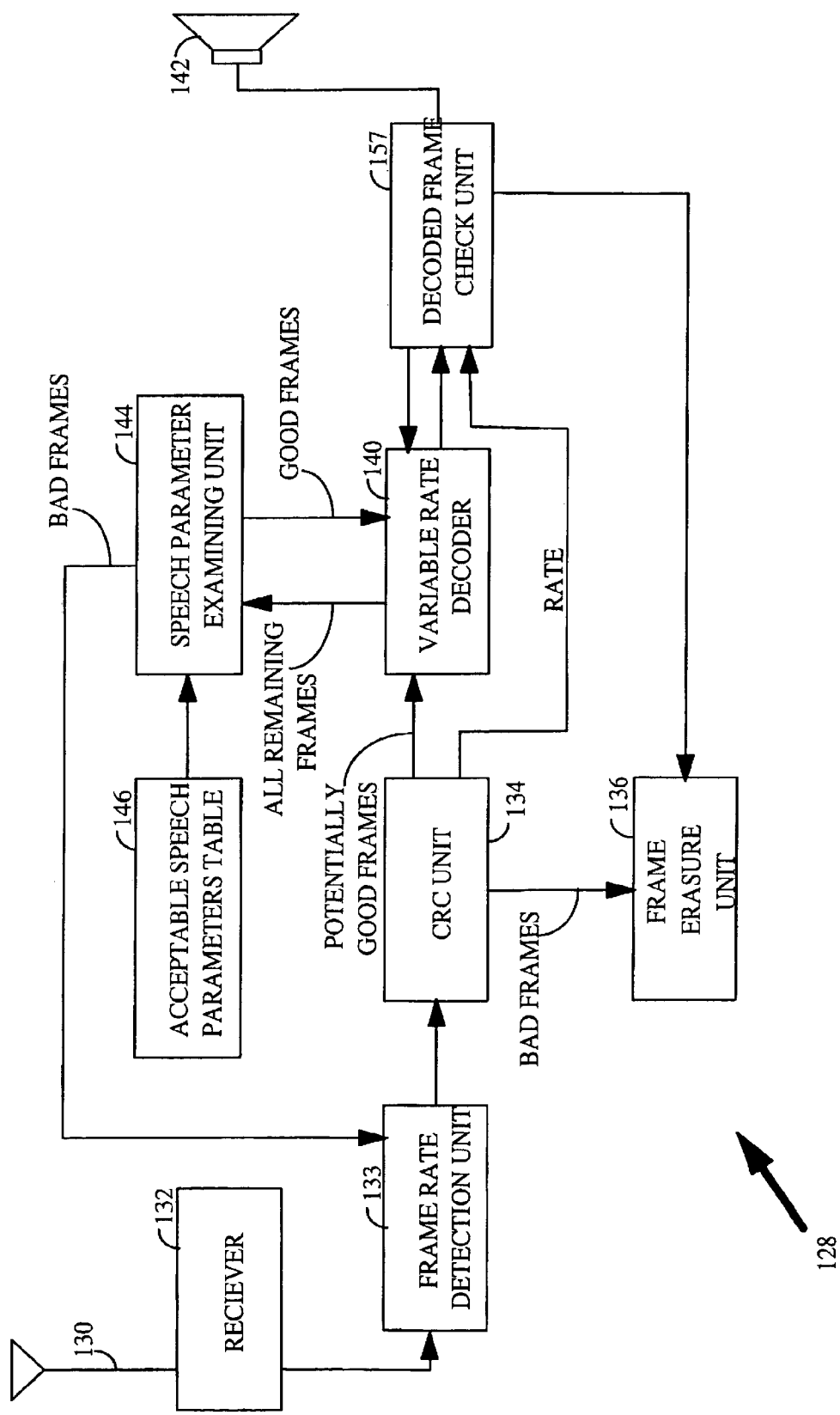
FIG. 4 is a block diagram of a receive portion of a cellular telephone, configured in accordance with the inventions of a speech parameter-based bad frame detection unit and a decode frame check unit, for receiving signals transmitted by the system of FIG. 1.

FIG. 4 illustrates pertinent components of a mobile telephone 128 or other mobile station receiving a signal provided by a base station transmission system such as the one of FIG. 1 wherein a signal having variable rate packets is transmitted. Frame rates include full rate, half rate, quarter rate and eighth rate as shown in FIGS. 2A–2D. The packets include encoded speech parameters representative of a compressed voice signal. In addition, each packet includes CRC bits and/or encoder tail bits. Additional details regarding the content of the packets is provided above in connection with FIG. 1 and in U.S. Pat. No. 5,414,796 referenced above.

Figure 3:
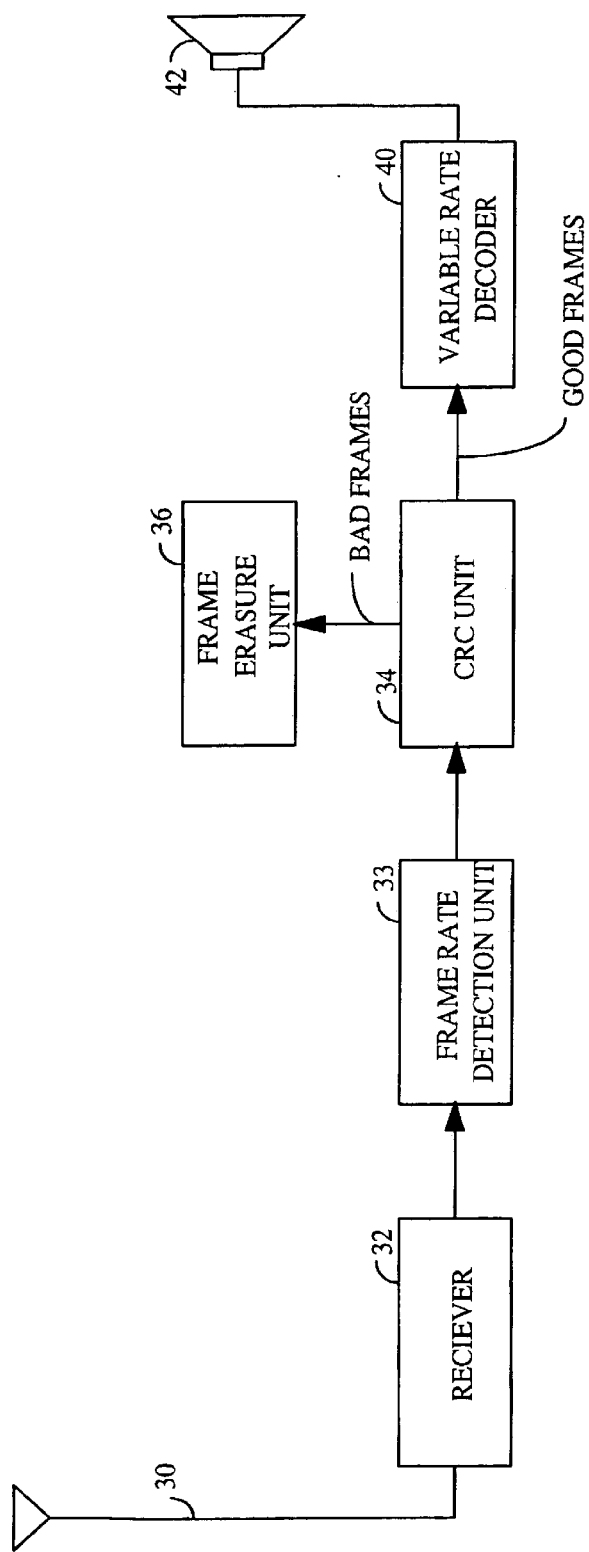
FIG. 3 is a block diagram of a receive portion of a cellular telephone, configured without the invention, for receiving signals transmitted by the system of FIG. 1.

The illustrated components of FIG. 4 are similar to those of FIG. 3 and only pertinent differences will be described in detail. The transmitted signal is received by antenna 130, downconverted and amplified by receiver 132. The signal is then provided to a frame rate detection unit 133 which attempts to determine the corresponding frame rate for the packet. The packet is then provided to a CRC unit 134 for performing cyclic redundancy checks on frames of the received signal in an attempt to verify that no frame rate detection error or transmission error occurred. Frames failing the CRC, i.e. bad frames, are erased by frame erasure unit 136. As noted above, no separate frame erasure unit is necessarily required. Rather, frames subject to CRC errors may merely not be output from CRC unit. In any case, frames which pass the CRC, i.e. potentially good frames, are routed to a variable rate decoder 140 which decodes any speech parameters contained therein for conversion back to digitized voice signals. The digitized voice signals are ultimately converted to analog signals by a digital to analog converter (not shown) for output through a speaker 142 of the mobile telephone to a listener.

The output frames of variable rate decoder 140 are provided to decoded frame check unit 157. In the exemplary embodiment, the rate of the frame is provided to decoded frame check unit 157 by CRC unit 134. Decoded frame check unit 157 examines the energy of the of the frame output by the variable rate decoder 140. In the exemplary embodiment, if the rate of the frame is eighth rate and the energy of the decoded frame exceeds a predetermined threshold then the frame is declared a frame error. In addition, decoded frame check unit 157 sends a signal to variable rate decoder 140 indicating the detection of the error. In response to the signal from decoded check unit 157, variable rate decoder 140 reinitializes and clears the memory of its filters. In response to a declared frame error either the output PCM speech is muted. In alternative embodiments, the output can be set to comfort noise.

In an alternative embodiment, decoded frame check unit 157 performs a DFT or FFT operation on the decoded frame. Decoded frame check unit 157 examines the energy of the frame that has frequency components over 3500 Hz, and if those components have an energy in excess of a predetermined threshold then decoded frame check unit 157 mutes the output and reinitializes the filter memories of variable rate decoder 140.

Speech parameters decoded by variable rate decoder 140 are routed to a speech parameter examining unit 144 which determines whether the decoded speech parameters lie within predetermined acceptable ranges of speech parameters stored within an acceptable speech parameters table 146. Only frames having data parameters within the acceptable ranges specified by table 146 are returned to variable rate decoder 140 and used for generating the digitized speech signal ultimately output via speaker 142. All other frames are routed to frame erasure unit 136.

Figure 5:
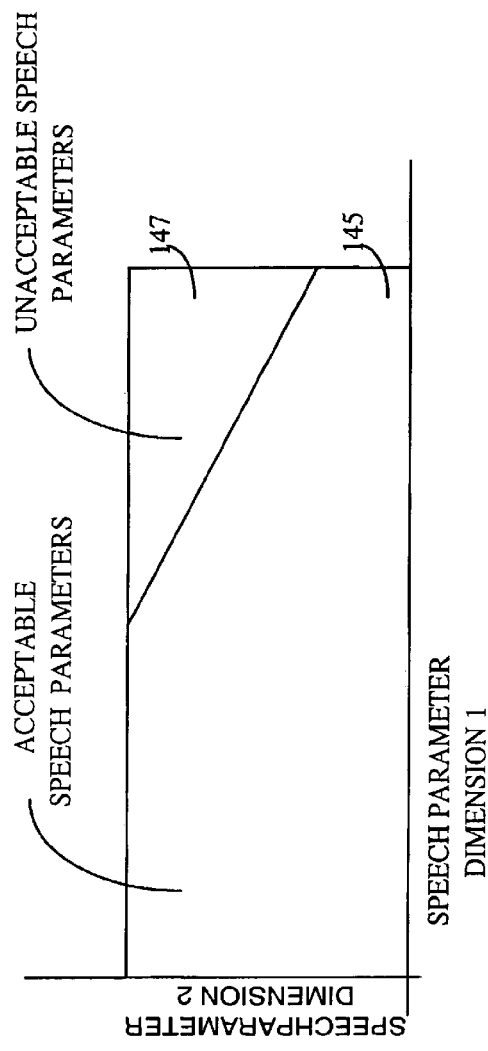
FIG. 5 is graph illustrating an exemplary range of acceptable speech parameters.

Thus, speech parameter examining unit 144 compares decoded speech parameters with acceptable ranges to identify frames containing speech parameters that lie outside the acceptable ranges. FIG. 5 graphically illustrates an acceptable range of speech parameters 145 for a system wherein two speech parameter dimensions are evaluated. For example, one dimension may represent LSP frequencies and the other codebook gain parameters, but in general any appropriate characteristics of the encoded speech signal may be utilized. A range of unacceptable speech parameters 147 is also illustrated in FIG. 5.

Depending upon the implementation, the acceptable ranges of speech parameters may be predetermined based upon the probability of encountering certain speech parameters in typical, transmitted human speech. For example, there is a low probability that transmitted human speech contains extremely low or high frequencies. Hence, the speech parameters may be examined to determine the corresponding frequency and if the frequency is found to be above or below certain predetermined thresholds specified in the acceptable speech range table 146, the system concludes that the speech parameters are incorrect. Of course, there is the possibility that the low probability speech parameters are perfectly correct, resulting in an erroneous frame erasure. Care should be taken to select the acceptable ranges of speech parameters to minimize the likelihood of unnecessary frame erasures. In this regard, acceptable speech parameter ranges may be determined empirically by evaluating the probabilities of encountering various speech parameters in typical speech and in other typical sounds expected to be transmitted including tones, dtmf signals, music, background noise etc. The resulting ranges may be tested against input signals known to be correct to identify the likelihood of unnecessary frame erasures and then adjusted accordingly. For systems capable of transmitting data as well as voice signals, the speech parameter-based frame erasure mechanism is preferably disabled during data transmissions.

Also, the acceptable ranges of speech parameters stored in table 146 may be tailored to the community expected to utilize the mobile telephone. For example, the acceptable ranges may be set differently for mobile telephones employed in communities where English is expected to be spoken as opposed to communities where another language having significantly different speech characteristics, such as Hottentot, is expected to be spoken. Furthermore, adaptive filtering techniques may be employed to vary the ranges with time, perhaps to compensate for an excessive number of packet erasures which likely indicates that the ranges are not optimally set.

In an exemplary implementation, speech is encoded using the aforementioned variable rate encoder of U.S. Pat. No. 5,414,796 at full, half (Rate 1/2), quarter (Rate 1/4) or eighth (Rate 1/8) rates having the CRC bits and encoder tail bits illustrated in FIGS. 2A–2D. A method, represented by pseudocode, for detecting bad packets using LSP frequencies and codebook gain parameters which are extracted or otherwise determined from the received packets, is as follows:

```
If rxrate == full or 1/2{
    if(.66 >= wq(10) or wq(10) <= .985) erase packet
    for(i=5; i<11; i++)
        if(abs(wq(n)−wq(n−4)) < .0931) erase packet
}
If rxrate == 1/4{
    if(.70 >= wq(10) or wq(10) >= .97) erase packet
    for(i=4; I<11; i++)
```

-continued

```
        if(abs(wq(n)−wq(n−3)) < .08) erase packet
}
if rxrate == 1/4{
    for(i = 0; i < 4; i++)
        if(abs(G₀(i+1) − G₀(i)) > 40) erase packet
    for(i=0; i<3; i++)
        if(abs(G₀(i+2)−2G₀(i+1) + G₀(i)) > 48) erase packet
}
``` where $wq(i)$ is an ith LSP parameter scaled from 0.0 to 1.0, $G_0(i)$ is an ith Rate 1/4 codebook gain parameter represented in dB from 0 to 60 dB, and rxrate is the detected frame rate of full, 1/2, 1/4 or 1/8.

As can be seen, the codebook gain test is applied only to the Rate 1/4 packets. This additional test is provided because the probability of receiving an incorrect packet at Rate 1/4 is greater than receiving an incorrect packet at Rate 1/2 or Rate 1. The probability is higher because Rate 1/4 has a smaller CRC and because, with the exemplary encoder of U.S. Pat. No. 5,414,796, Rate 1/4 is used to code only unvoiced or temporally masked speech. Hence, Rate 1/4 packets are subject to stricter testing. No testing is applied to Rate 1/8 packets.

What has been primarily described is a method and apparatus for detecting bad packets occurring because of frame rate detection errors by comparing speech parameters encoded within, or derivable from, the packets against ranges of acceptable parameters. The techniques also apply to detecting errors caused by other factors as well. Also, techniques of the invention are applicable in other signal transmission systems, including those which do not represent data in packets or which do not employ variable rates. In general, principles of the invention are applicable in almost any system wherein some amount of redundancy occurs in a transmitted signal, i.e. wherein a greater number of bits are employed to encode information than is minimally necessary. Typically, in such systems, all possible data patterns are not equally probable. If the possible data patterns are not equally probable then the techniques of the invention may be exploited to distinguish "good" data from "bad" data based on the probability of occurrence. If all data patterns are equally probably no such distinction can typically be made.

Figure 6:
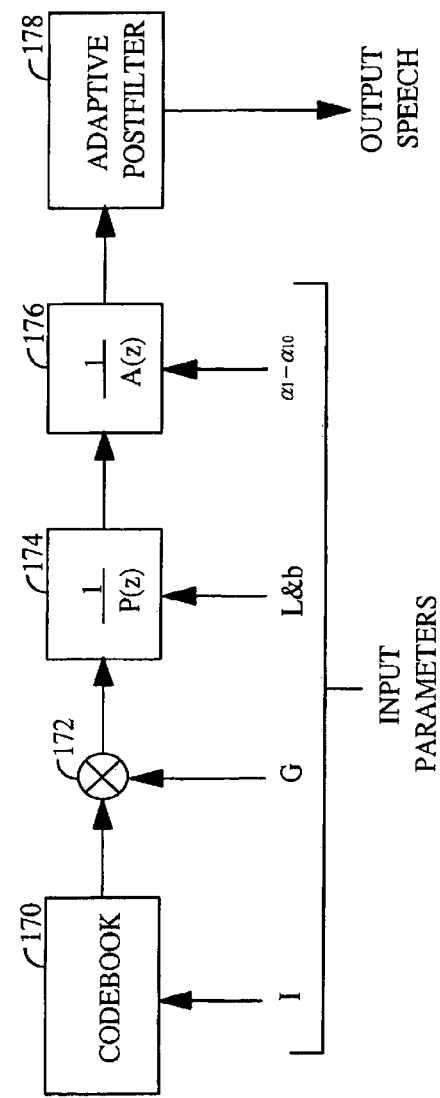
FIG. 6 is an illustration of the exemplary embodiment of the speech decoder.

FIG. 6 illustrates the exemplary implementation of variable rate decoder 140 in greater detail. In the exemplary embodiment, variable rate decoder 140 is a CELP decoder as described in detail in the aforementioned U.S. Pat. No. 5,414,796 (the '796 patent). The codebook index I is provided to codebook element 170 which retrieves an excitation vector in accordance with the index I. The selected codebook index is provided to multiplier 172 and multiplied by the gain value G. The product from multiplier 172 is provided to pitch filter 174 which filters the product in accordance with a pitch filter parameters L & b as is known in the art and described in the aforementioned '796 patent. The pitch filtered signal is then provided to formant filter 176 which filters the pitch filtered signal in accordance with linear predictive code (LPC) coefficients $\alpha_1$–$\alpha_{10}$. The output of the formant filter is provided to the adaptive postfilter 178 which post filters the output to provide improved perceptual quality.

Figure 7:
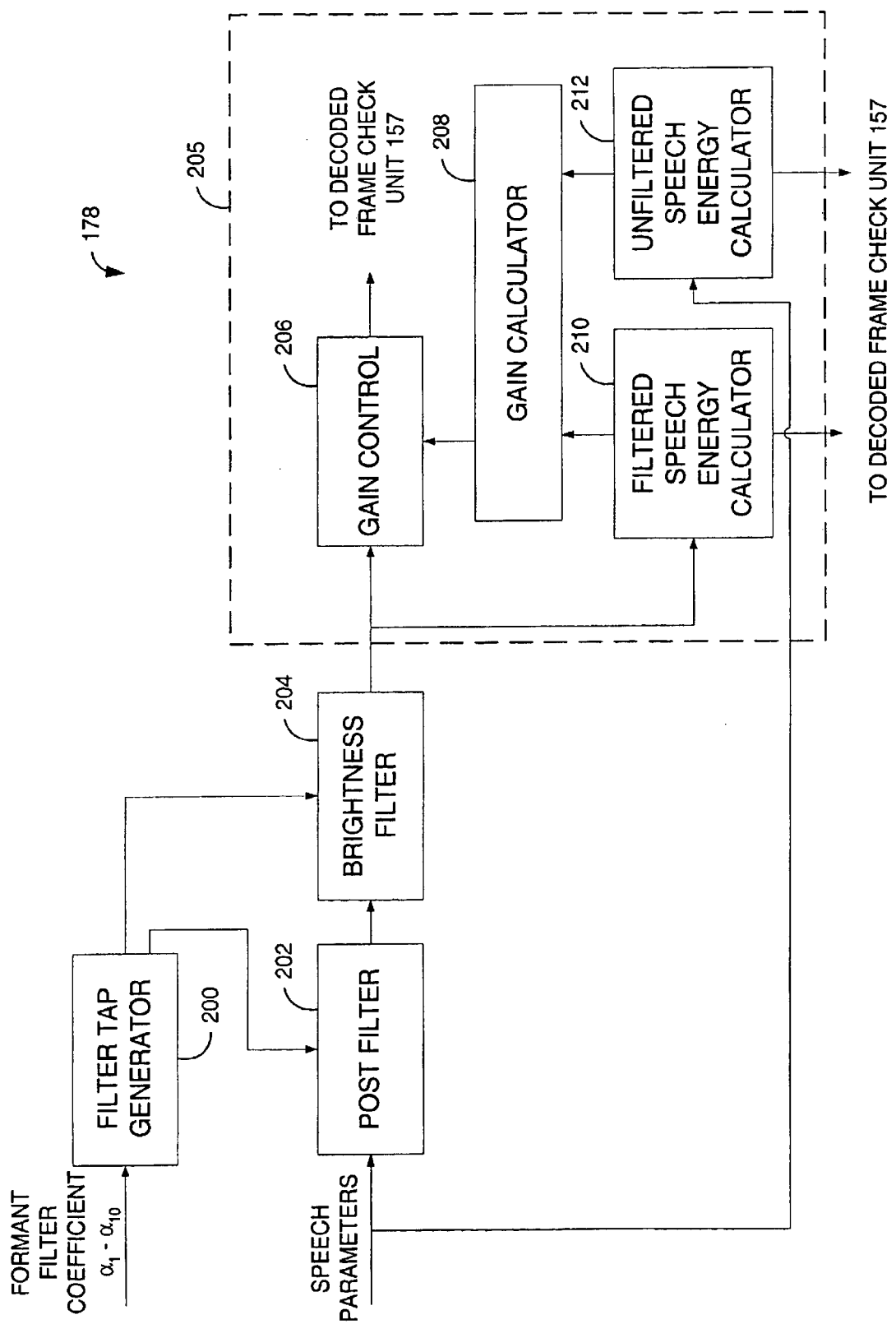
FIG. 7 is a block diagram of the post filter of the exemplary speech decoder.

FIG. 7 illustrates the adaptive post filter 178 of the exemplary embodiment. The postfilters used in this implementation were first described in "Real-Time Vector APC Speech Coding At 4800 BPS with Adaptive postfiltering" by J. H. Chen et al., Proc. ICASSP, 1987. Since speech formants are perceptually more important than spectral valleys, the postfilter boosts the formants slightly to improve the perceptual quality of the coded speech. This is done by scaling the poles of the formant synthesis filter radially toward the origin in postfilter 202. However, an all pole postfilter generally introduces a spectral tilt which results in muffling of the filtered speech. The spectral tilt of this all pole postfilter is reduced by adding zeros having the same phase angles as the poles but with smaller radii, resulting in a postfilter of the form:

$$H(z) = \frac{A(z/\rho)}{A(z/\sigma)} \quad 0 < \rho < \sigma < 1 \tag{1}$$

where A(z) is the formant prediction filter and the values $\rho$ and $\sigma$ are the postfilter scaling factors where $\rho$ is set to 0.5, and $\sigma$ is set to 0.8. The computation of the filter coefficients is performed by filter tap generator 200 in accordance with the formant filter tap coefficients $\alpha_1$–$\alpha_{10}$.

An adaptive brightness filter 204 is added to further compensate for the spectral tilt introduced by the formant postfilter. The brightness filter is of the form:

$$B(z) = \frac{1 - \kappa z^{-1}}{1 + \kappa z^{-1}} \tag{2}$$

where the value of $\kappa$ (the coefficient of this one tap filter) is determined by the average value of the LSP frequencies which approximates the change in the spectral tilt of A(z). The tap values of brightness filter 204 are generated by filter tap generator 200 in the formant filter tap coefficients $\alpha_1$–$\alpha_{10}$.

To avoid any large gain excursions resulting from postfiltering, an AGC loop 205 is implemented to scale the speech output so that it has roughly the same energy as the non-postfiltered speech. Gain control is accomplished by dividing the sum of the squares of the 40 filter input samples computed in unfiltered speech energy calculator 212 by the sum of the squares of the 40 filter output samples computed in filtered speech energy calculator 214 to get the inverse filter gain. The square root of this gain factor is then smoothed:

Smoothed $\beta$=0.2 current $\beta$+0.98 previous $\beta$ (3)

and then the filter output is scaled in gain control element 206 by this smoothed inverse gain which is computed in gain calculator 208 to produce the output speech. In the preferred embodiment, the energy computed by unfiltered speech energy calculator 212 is provided to decoded frame check unit 157 reducing the amount of additional hardware necessary for the added protection against improperly decoded frames. If the decoded rate is eighth rate, and the energy is greater than a predefined threshold value, T, the output is muted.

Figure 8:
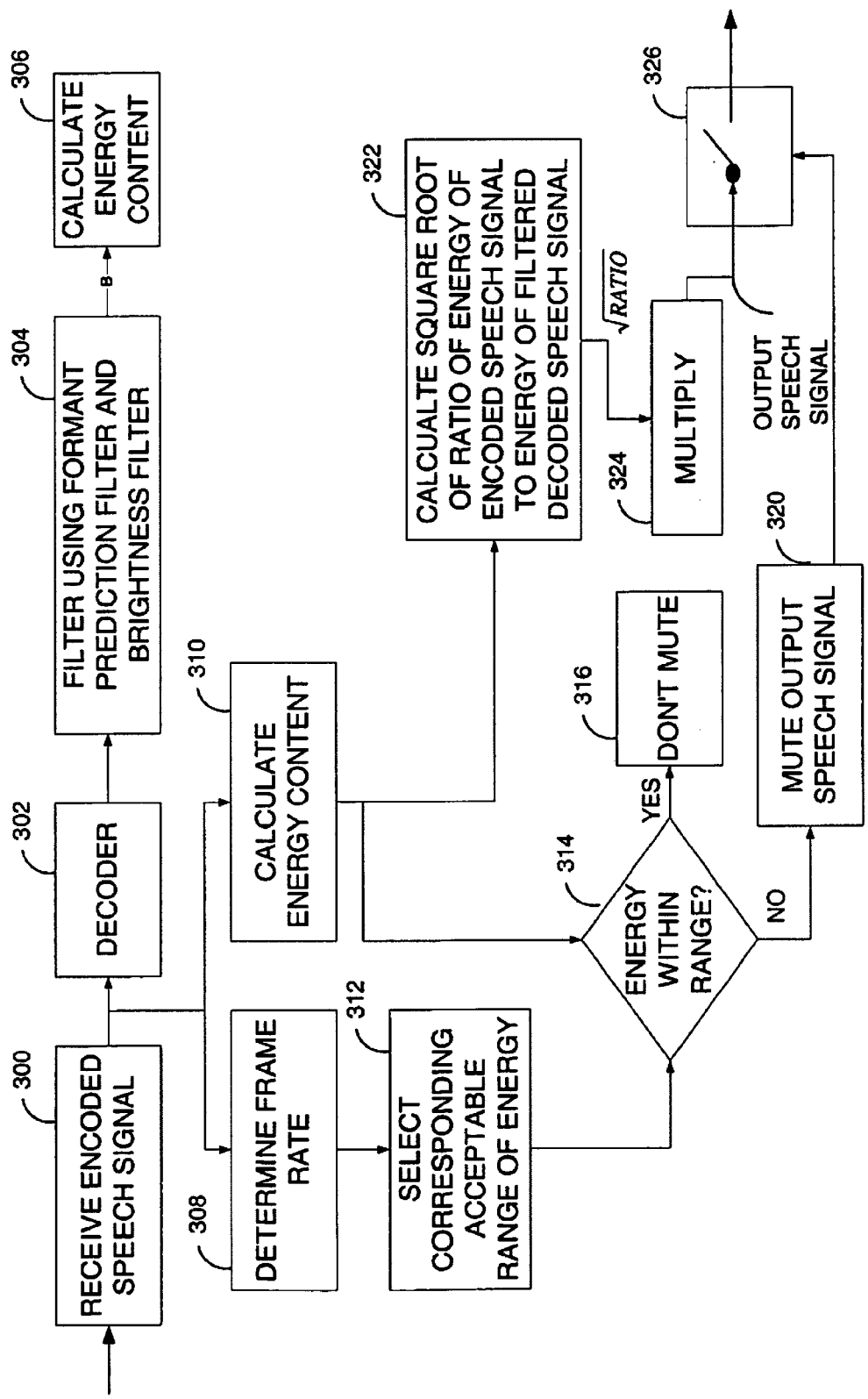
FIG. 8 is a flow chart illustrating method steps performed by the exemplary speech decoder.
Figure 9:
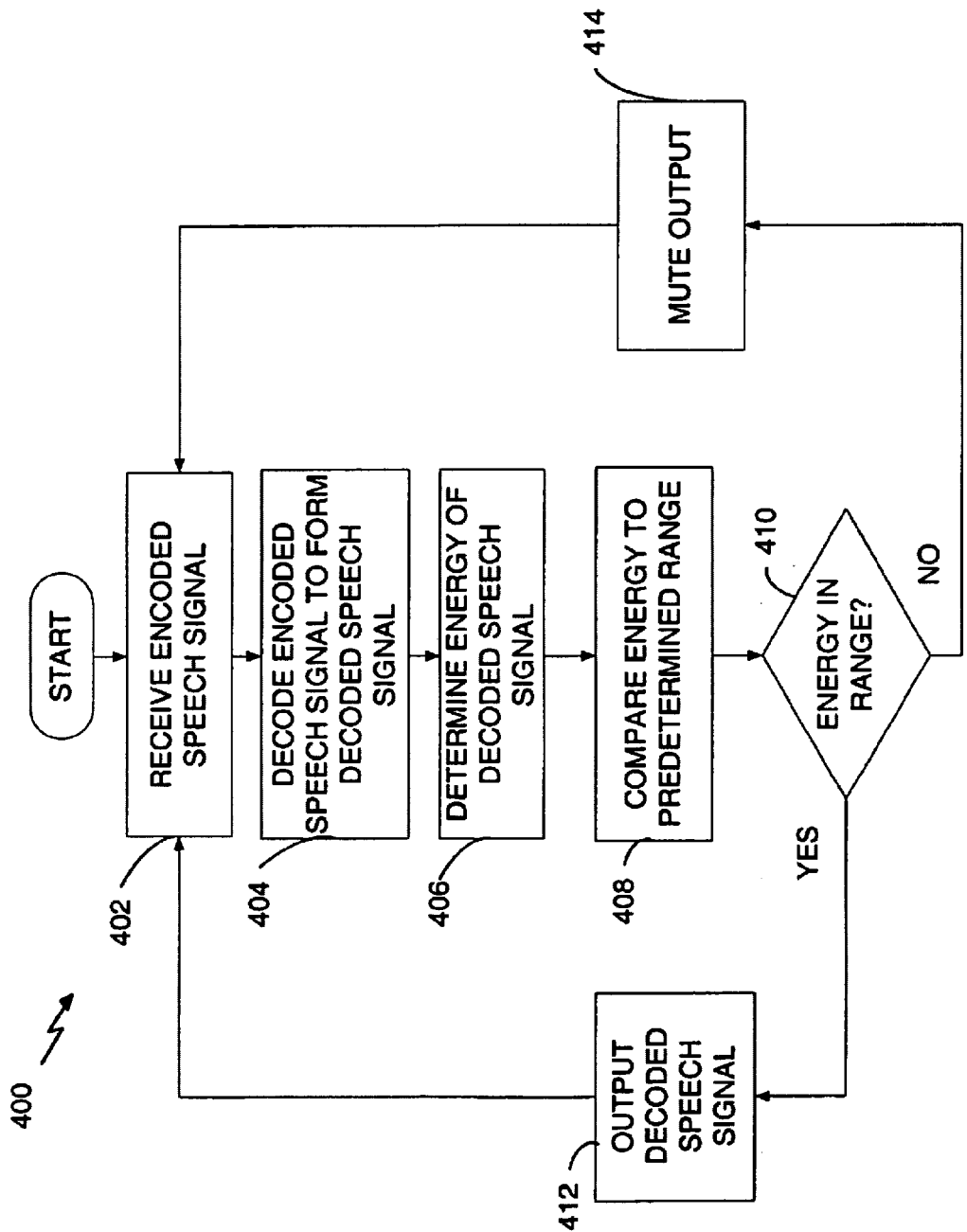
FIG. 9 illustrates a method described herein.

In accordance with one embodiment, an exemplary speech decoder performs the method steps illustrated in the flow chart of FIG. 8. In step 300 an encoded speech signal is received by the decoder. In step 302 the received encoded speech signal is decoded in accordance with known decoding methods such as, e.g., maximum-likelihood decoding. In step 304 the decoded signal is filtered, using a formant prediction filter and a brightness filter as described above. In step 306 the energy content of the filtered signal is calculated in accordance with known energy calculation methods such as, e.g., root-mean-square summation.

In step 308 the frame rate of the received encoded speech signal is determined in accordance with known frame rate determination methods. In step 310 the energy of the received encoded speech signal is calculated in accordance with known methods such as, e.g., root-mean-square summation. In step 312 a corresponding acceptable range of energy for the calculated frame rate of step 308 is selected. In step 314 the decoder checks whether the calculated energy content of step 310 is within the selected range of energy of step 312. If the calculated energy content is within the selected energy range, the output of a speaker 318 is not muted, in accordance with step 316. If, on the other hand, in step 314, the calculated energy content is not within the selected energy range, the output speech signal is muted, in accordance with step 320.

In step 322 the energy content of the received encoded speech signal (calculated in step 310) is divided by the energy content of the decoded, filtered speech signal (calculated in step 306), yielding a ratio. The square root of the ratio is then calculated. The calculations may be performed in accordance with a number of known digital signal processing (DSP) techniques.

In step 324 the square root of the ratio is multiplied by decoded, filtered speech signal, generating an output speech signal. The output speech signal is passed through a switch 326, which mutes the output speech signal as necessary in accordance with steps 314 and 320. The output speech signal is then provided to the speaker 318, which generates audible output sound for a user.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A method for receiving a speech signal, comprising:

receiving an encoded speech signal; and decoding the encoded speech signal to provide a decoded speech signal;

calculating an energy content of the encoded speech signal;

determining if the energy content is within a predetermined range of energy values;

controlling an output speech signal based on the energy content;

calculating a second energy content of the decoded speech signal; and calculating a ratio of the second energy content to the energy content; and outputting the decoded speech signal according to the ratio.

2. The method as in claim 1, further comprising:

determining a frame rate of the encoded speech signal; and selecting a corresponding range of energy values based on the frame rate of the encoded speech signal.

3. The method as in claim 1, wherein calculating the ratio further comprises:

calculating a square root of the ratio; and multiplying the decoded speech signal by the square root of the ratio.

4. The method as in claim 3, further comprising:

filtering the decoded speech signal.

5. A speech signal receiving system, comprising:

means for receiving an encoded speech signal;

means for decoding said encoded speech signal to provide a decoded speech signal;

means for calculating an energy content of the encoded speech signal;

means for determining if the energy content is within a predetermined range of energy values;

means for controlling an output speech signal based on the energy content;

means for calculating a second energy content of the decoded speech signal;

means for calculating a ratio of the second energy content to the energy content; and means for outputting the decoded speech signal according to the ratio.

6. A method for receiving a speech signal, comprising:

receiving an encoded speech signal;

decoding the encoded speech signal to provide a decoded speech signal;

calculating an energy content of the encoded speech signal;

determining if the energy content is within a predetermined range of energy values;

controlling an output speech signal based on the energy content;

calculating a second energy content of the decoded speech signal;

calculating a ratio of the second energy content to the energy content; and outputting the decoded speech signal according to the ratio.

7. The method as in claim 6, wherein calculating the ratio further comprises:

calculating a square root of the ratio; and multiplying the decoded speech signal by the square root of the ratio.

8. The method as in claim 7, further comprising:

filtering the decoded speech signal.

* * * * *